(12) United States Patent
Yoo et al.

(10) Patent No.: US 9,293,208 B2
(45) Date of Patent: Mar. 22, 2016

(54) SEMICONDUCTOR MEMORY APPARATUS AND METHOD FOR READING DATA FROM THE SAME

(71) Applicant: SK hynix Inc., Icheon-si Gyeonggi-do (KR)

(72) Inventors: Hyun Seung Yoo, Yongin-si (KR); Moon Sik Seo, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 47 days.

(21) Appl. No.: 14/189,240

(22) Filed: Feb. 25, 2014

(65) Prior Publication Data

US 2015/0085576 A1 Mar. 26, 2015

(30) Foreign Application Priority Data

Sep. 23, 2013 (KR) ......................... 10-2013-0112722

(51) Int. Cl.
| | |
|---|---|
| G11C 16/04 | (2006.01) |
| G11C 16/24 | (2006.01) |
| G11C 16/06 | (2006.01) |
| G11C 16/34 | (2006.01) |
| G11C 7/02 | (2006.01) |
| G11C 7/12 | (2006.01) |

(52) U.S. Cl.
CPC ........ *G11C 16/24* (2013.01); *G11C 7/02* (2013.01); *G11C 7/12* (2013.01); *G11C 16/0483* (2013.01); *G11C 16/06* (2013.01); *G11C 16/3454* (2013.01)

(58) Field of Classification Search
USPC .............. 365/185.11, 185.17, 185.25, 185.26
See application file for complete search history.

(56) References Cited

U.S. PATENT DOCUMENTS

| | | | |
|---|---|---|---|
| 2002/0097603 A1* | 7/2002 | Tanaka et al. ............ | 365/185.03 |
| 2007/0025152 A1 | 2/2007 | Futatsuyama | |
| 2009/0290422 A1* | 11/2009 | Cha et al. ................. | 365/185.19 |

* cited by examiner

*Primary Examiner* — Hoai V Ho
(74) *Attorney, Agent, or Firm* — William Park & Associates Ltd.

(57) ABSTRACT

A semiconductor memory apparatus includes a memory block including memory cells coupled between a bit line and a source line and operating in response to voltages applied to word lines, and a peripheral circuit suitable for performing operations relating to data input and output of the memory cells, wherein the peripheral circuit is suitable for applying a precharge voltage to the bit line when word lines adjacent to a selected word line are set to a floating state.

17 Claims, 15 Drawing Sheets

SEMICONDUCTOR MEMORY APPARATUS AND METHOD FOR READING DATA FROM THE SAME

CROSS-REFERENCE TO RELATED APPLICATION

The present application claims priority to Korean patent application number 10-2013-0112722 filed on Sep. 23, 2013, in the Korean Intellectual Property Office, the entire disclosure of which is incorporated by reference herein.

BACKGROUND

1. Technical Field

Various embodiments relate generally to a semiconductor memory apparatus and, more particularly, to a semiconductor memory apparatus including a memory cell coupled to a word line.

2. Related Art

A sufficient amount of current is to be ensured in order to improve input and output operating characteristics of memory cells. However, operating characteristics may be deteriorated due to changes in the structure of a memory block or a reduction in size of memory cells.

BRIEF SUMMARY

Various embodiments relate to a semiconductor memory apparatus capable of improving operating characteristics.

A semiconductor memory apparatus according to an embodiment of the present invention may include a memory block including memory cells coupled between a bit line and a source line and operating in response to voltages applied to word lines, and a peripheral circuit suitable for performing operations relating to data input and output of the memory cells, wherein the peripheral circuit is suitable for applying a precharge voltage to the bit line when word lines adjacent to a selected word line are set to a floating state.

A semiconductor memory apparatus according to an embodiment of the present invention may include a memory block including memory cells coupled between a bit line and a source line and operating in response to voltages applied to word lines, and a peripheral circuit suitable for performing operations related to data input and output of the memory cells, wherein the peripheral circuit is suitable for applying a pass voltage to a word line adjacent to a selected word line in a direction of the bit line and subsequently applying a precharge voltage to the bit line when the word line adjacent to the selected word line is set to the floating state.

A semiconductor memory apparatus according to an embodiment of the present invention may include a memory block including memory cells operating in response to voltages applied to word lines and selection transistors operating in response to voltages applied to selection lines between a bit line and a source line, and a peripheral circuit suitable for performing operations related to data input and output of the memory cells, wherein the peripheral circuit is suitable for turning on the selection transistors when a pass voltage is applied to unselected word lines and turning off and subsequently turning on the selection transistors when the precharge voltage is applied to the bit line and the unselected word lines are set to a floating state.

A memory system according to an embodiment may include: a non-volatile memory apparatus; and a memory controller configured for controlling the non-volatile memory apparatus, wherein the non-volatile memory apparatus includes: a memory block including memory cells coupled between a bit line and a source line and operating in response to voltages applied to word lines; and a peripheral circuit suitable for performing operations relating to data input and output of the memory cells, wherein the peripheral circuit is suitable for applying a precharge voltage to the bit line when word lines adjacent to a selected word line are set to a floating state.

A OneNand flash memory apparatus according to an embodiment may include: a NAND flash cell array; and a controller configured to perform read and write operations in response to a control signal received externally from the controller, wherein the NAND flash cell array includes: a memory block including memory cells coupled between a bit line and a source line and operating in response to voltages applied to word lines; and a peripheral circuit suitable for performing operations relating to data input and output of the memory cells, wherein the peripheral circuit is suitable for applying a precharge voltage to the bit line when word lines adjacent to a selected word line are set to a floating state.

A computing system according to an embodiment may include a memory system and a central processing unit, the memory system including: a semiconductor memory apparatus; and a memory controller configured to control the semiconductor memory apparatus, wherein the semiconductor memory apparatus includes: a memory block including memory cells coupled between a bit line and a source line and operating in response to voltages applied to word lines; and a peripheral circuit suitable for performing operations relating to data input and output of the memory cells, wherein the peripheral circuit is suitable for applying a precharge voltage to the bit line when word lines adjacent to a selected word line are set to a floating state.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added. Additionally, wherever possible, the same reference numbers will be used throughout the drawings to refer to the same or like parts unless otherwise noted.

Figure 1:
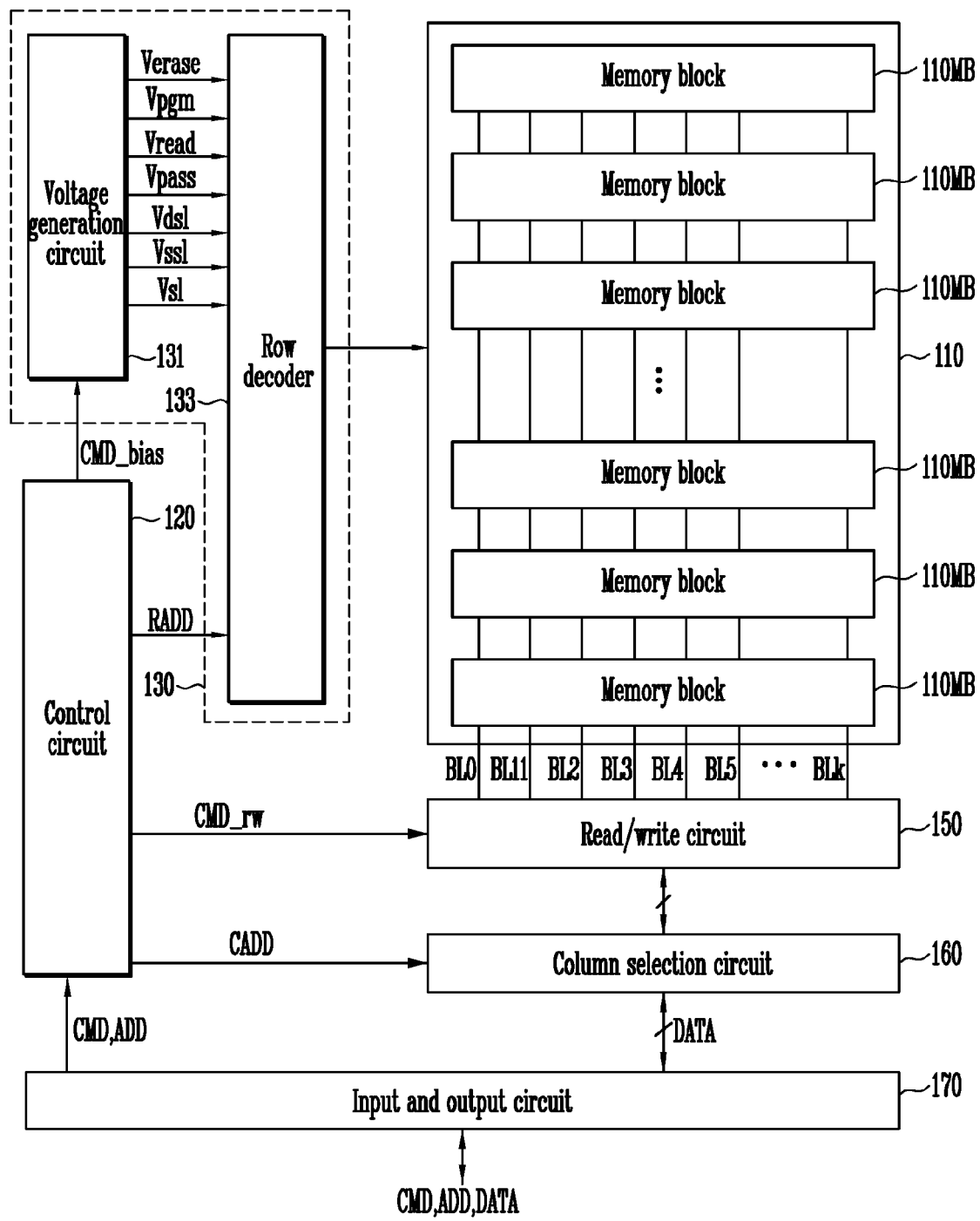
FIG. 1 is a block diagram illustrating a semiconductor memory apparatus according to an embodiment of the present invention.

FIG. 1 is a block diagram illustrating a semiconductor memory apparatus according to an embodiment of the present invention.

Referring to FIG. 1, the semiconductor memory apparatus may include a memory array 110 and peripheral circuits 120 to 160.

The memory array 110 may include a plurality of memory blocks 110MB. The configuration of the memory blocks 110MB is described below.

Figure 2A:
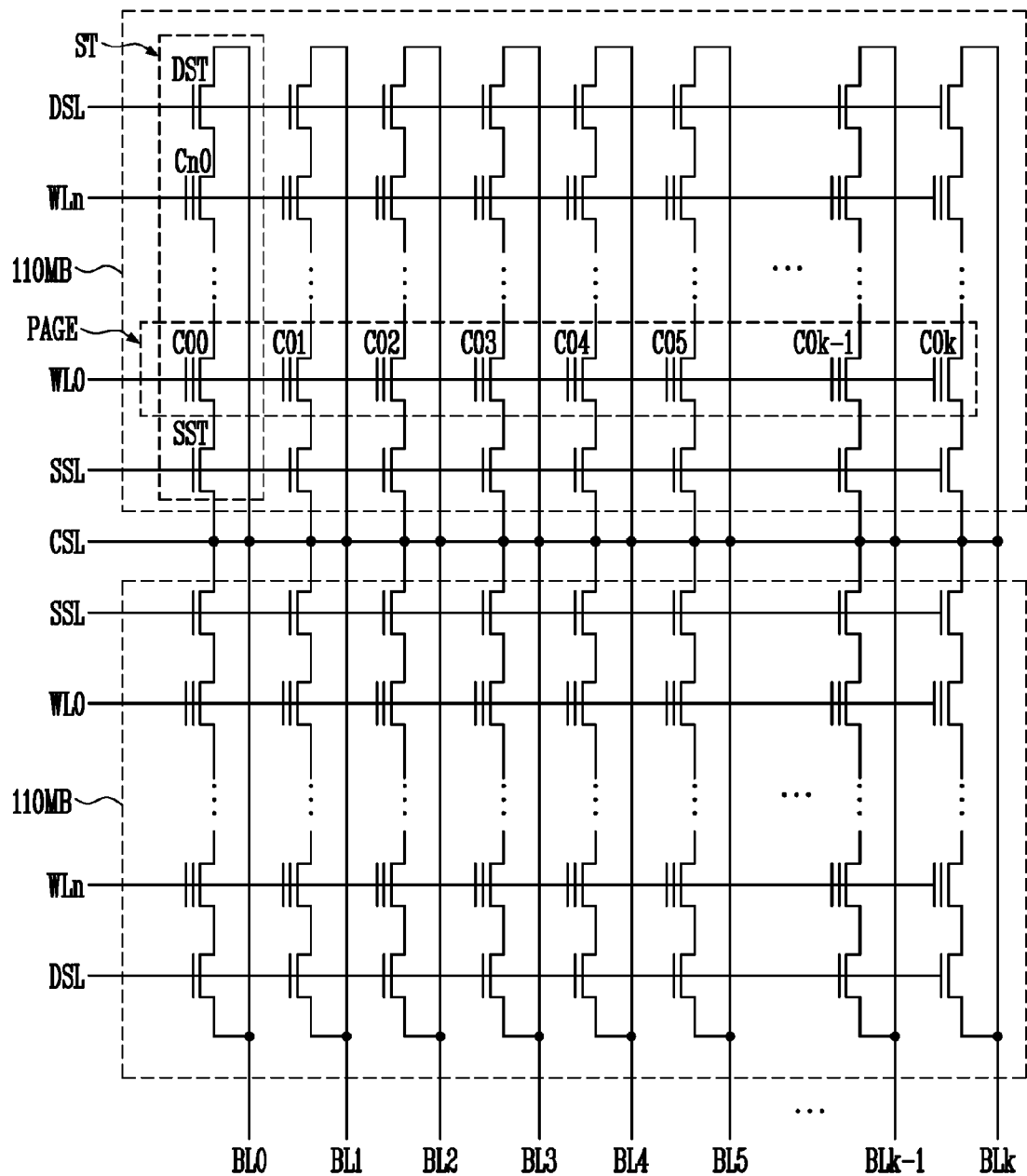
FIGS. 2A and 2B are circuit diagrams illustrating embodiments of memory blocks shown in FIG. 1.
Figure 2B:
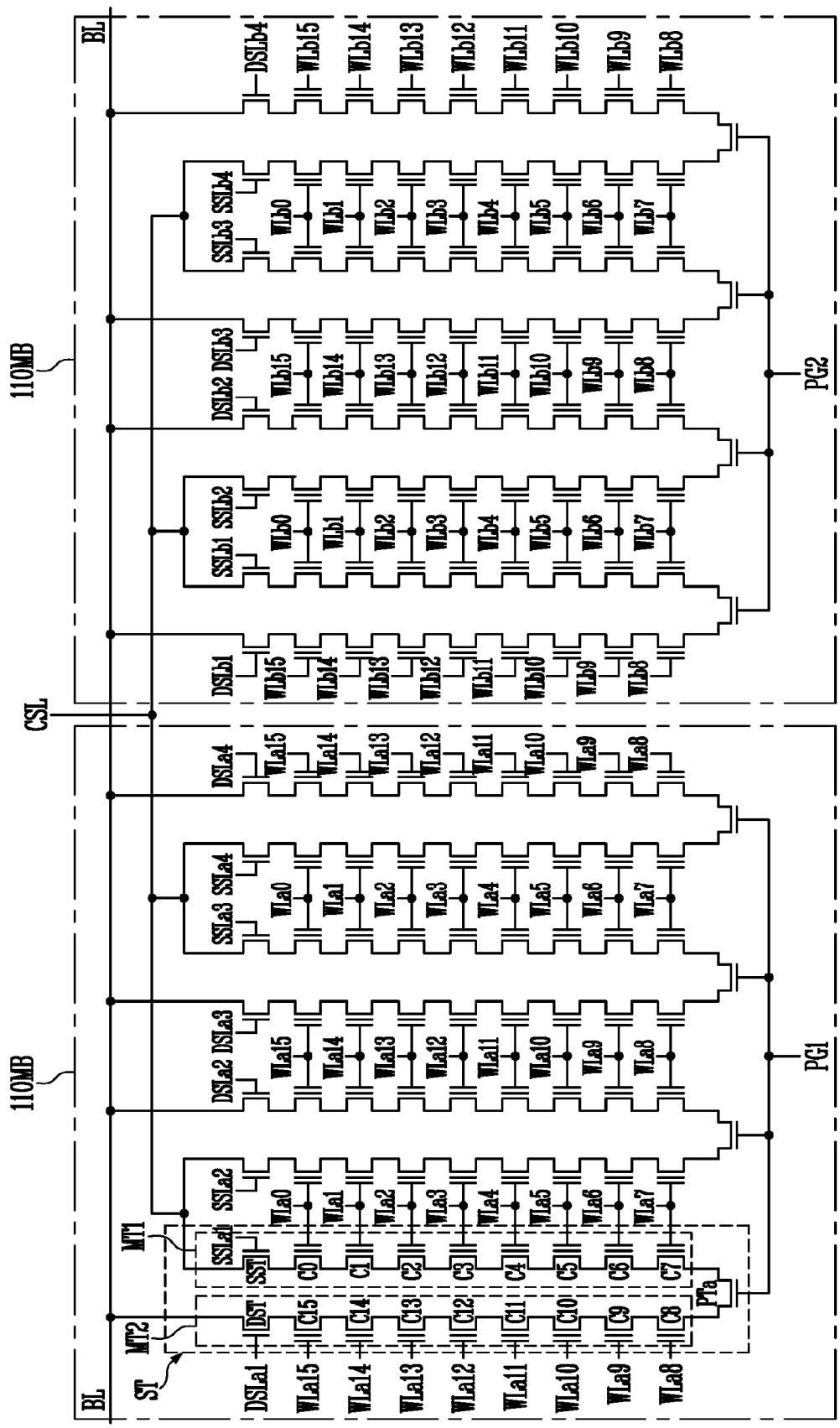

FIGS. 2A and 2B are circuit diagrams illustrating embodiments of the memory blocks shown in FIG. 1.

Referring to FIG. 2A, each of the memory blocks 110MB may include a plurality of memory strings ST that are coupled between bit lines BL0 to BLk and a common source line CSL. In other words, each of the memory strings ST may correspond to each of the bit lines BL0 to BLk, and the memory strings ST may be coupled in common to the common source line CSL. Each of the memory strings ST may include a source selection transistor SST having a source coupled to the common source line CSL, a cell string to which the memory cells C00 to Cn0 are coupled in series, and a drain selection transistor DST having a drain coupled to the bit line BL0. The memory cells C00 to Cn0, included in the cell string, may be coupled in series between the source and drain selection transistors SST and DST. A gate of the source selection transistor SST may be coupled to a source selection line SSL, gates of the memory cells C00 to Cn0 may be coupled to word lines WL0 to WLn, respectively, and a gate of the drain selection transistor DST may be coupled to the drain selection line DSL.

The drain selection transistor DST may control connection or disconnection between the cell strings C00 to Cn0 and the bit lines, and the source selection transistor SST may control connection or disconnection between the cell strings C00 to Cn0 and the common source line CSL.

In a NAND flash memory, memory cells included in a memory cell block may be divided into physical pages or logical pages. For example, the memory cells C00 to C0k coupled to a single word line, e.g., the word line WL0 may form a single physical page PAGE. In addition, even-numbered memory cells C00, C01, C03, C05 and C0k, coupled to the word line WL0, may form a single even physical page, and odd-numbered memory cells C00, C02, C04 and C0k−1 may form a single odd physical page. These pages (or even and odd pages) may be a basic unit for a program operation or a read operation.

Referring to FIG. 2B, when the memory blocks 110MB have a three-dimensional structure, each of the memory blocks 110MB may include the memory strings ST. For example, in a P-BiCS structure, each of the memory strings ST may include a first memory string MT1 and a second memory string MT2. The first memory string MT1 may be coupled in a vertical direction between the common source line CSL and a pipe transistor Pta of a substrate. The second memory string MT2 may be coupled between the bit line BL and the pipe transistor Pta of the substrate. The first memory string MT1 may include the source selection transistor SST and memory cells C0 to C7. The source selection transistor SST may be controlled by a voltage applied to a source selection line SSLa1, and the memory cells C0 to C7 may be controlled by voltages applied to the stacked word lines WLa0 to WLa7. The second memory string MT2 may include the drain selection transistor DST and memory cells C8 to C15. The drain selection transistor DST may be controlled by a voltage applied to a drain selection line DSLa1, and the memory cells C8 to C15 may be controlled by voltages applied to the stacked word lines WLa8 to WLa15.

When the memory block 110MB is selected, the pipe transistor Pta, which is coupled between a pair of the memory cells C7 and C8 located in the middle of the memory string of the P-BiCS structure, may electrically connect channel layers of the first memory string MT1, included in the selected memory block 110MB, and channel layers of the second memory string MT2.

In a memory block having a two-dimensional structure, a single memory string may be coupled to each bit line, and drain selection transistors of the memory block may be simultaneously controlled by a single drain selection line. However, in the memory block 110MB having a 3D structure, the memory strings ST may be coupled in common to each bit line BL. The number of memory string ST that are coupled in common to the single line BL and controlled by the same word lines within the same memory block 110MB may vary according to different design needs.

Since the plurality of memory strings are coupled in parallel with the single bit line BL, the drain selection transistors DST may be independently controlled by selection voltages applied to drain selection lines DSLa1 to DSLa4 in order to selectively couple the single bit line BL to the memory strings ST.

The memory cells C0 to C7 of the first memory string MT1 and the memory cells C8 to C15 of the second memory string MT2, which are coupled in the vertical direction in the memory block 110MB, may be individually controlled by operating voltages applied to stacked word lines WLa0 to WLa7 and stacked word lines WLa8 to WLa15. These word lines WLa0 to WLa15 may be divided into memory block units. In FIG. 2B, word lines WLb0 to WLb15, drain selection lines DSLb1 to DSLb4, source selection line SSLa1 to SSLa4, SSLb1 to SSLb4, and pipe gates PG1 and PG2 are also illustrated.

Referring again to FIGS. 1 and 2A, the peripheral circuits 120 to 160 may be suitable for performing a program loop, an erase loop and a read operation on the memory cells C00 to C0k coupled to a selected word line, e.g., the word line WL0. The peripheral circuits 120 to 160 may be suitable for performing a program loop, an erase loop and a read operation in response to control of the control circuit 120. In order to perform the program loop, the erase loop and the read operation, the peripheral circuits 120 to 160 may be suitable for selectively outputting operating voltages Verase, Vpgm, Vread, Vpass, Vdsl, Vssl and Vsl to local lines SSL, WL0 to WLn and DSL and the common source line CSL of the selected memory block, controlling a precharge or discharge operation of the bit lines BL0 to BLk, or sensing a current flow through the bit lines BL0 to BLk.

In a NAND flash memory, an operation circuit may include a control circuit 120, a voltage supply circuit 130, a read/write circuit 150, a column selection circuit 160 and an input/output circuit 170. Each component is described below.

The control circuit 120 may output a voltage control signal CMD_bias in response to a command signal CMD, which is input from exterior through the input/output circuit 170, in order to control the voltage supply circuit 130 so that the operating voltages Verase, Vpgm, Vread, Vpass, Vdsl, Vssl and Vsl may be generated at desired levels to perform a program loop, an erase loop and a read operation. In addition, the control circuit 120 may output control signals CMD_rw for controlling the read/write circuit 150 in order to perform the program loop, the erase loop and the read operation. In addition, when an address signal ADD is input to the control circuit 120, the control circuit 120 may output a column address signal CADD and a row address signal RADD. The row address RADD may be output to the voltage supply circuit 130, and the column address CADD may be output to the column selection circuit 160.

The voltage supply circuit 130 may generate the operating voltages Verase, Vpgm, Vread, Vpass, Vdsl, Vssl and Vsl used to perform the program loop, the erase loop and the read operation on memory cells in response to the voltage control signal CMD_bias of the control circuit 120. The voltage supply circuit 130 may output the operating voltages to the common source line CSL and the local lines SSL, WL0 to WLn and DSL of the selected memory block in response to the row address signal RADD from the control circuit 120.

The voltage supply circuit 130 may include a voltage generator 131 and a row decoder 133. The voltage generator 131 may generate the operating voltages Verase, Vpgm, Vread, Vpass, Vdsl, Vssl and Vsl in response to the voltage control signal CMD_bias of the control circuit 120. The row decoder 133 may transfer the operating voltages to the common source line CSL and the local lines SSL, WL0 to WLn and DSL of the selected memory block, among the memory blocks 110MB, in response to the row address signal RADD from the control circuit 120.

As described above, the voltage supply circuit 130 may output and change the operating voltages Verase, Vpgm, Vread, Vpass, Vdsl, Vssl and Vsl to be described below in response to the voltage control signal CMD_bias from the control circuit 120.

The read/write circuit 150 may be coupled to the memory blocks 110MB of the memory array 110 through the bit lines BL0 to BLk. The read/write circuit 150 may selectively precharge the bit lines BL0 to BLk in response to the control signal CMD_rw from the control circuit 120 and the data DATA to be stored in the memory cells during a program operation. During a program verify operation or a read operation, the read/write circuit 150 may precharge the bit lines BL0 to BLk, sense changes in voltage or current of the bit lines BL0 to BLk and latch data, read from the memory cells, in response to the control signal CMD_rw from the control circuit 120.

The column selection circuit 160 may sequentially transfer the data from the input/output circuit 170 to the read/write circuit 150 or may sequentially transfer the data, latched to the read/write circuit 150, to the input/output circuit 170 in response to the column address CADD output from the control circuit 120.

The input/output circuit 170 may transfer the command signal CMD and the address signal ADD, which are externally input, to the control circuit 120. In addition, the input/output circuit 170 may transfer the externally input data DATA to the column selection circuit 160 during a program operation or may externally output the data, read from the memory cells, during a read operation.

Figure 3:
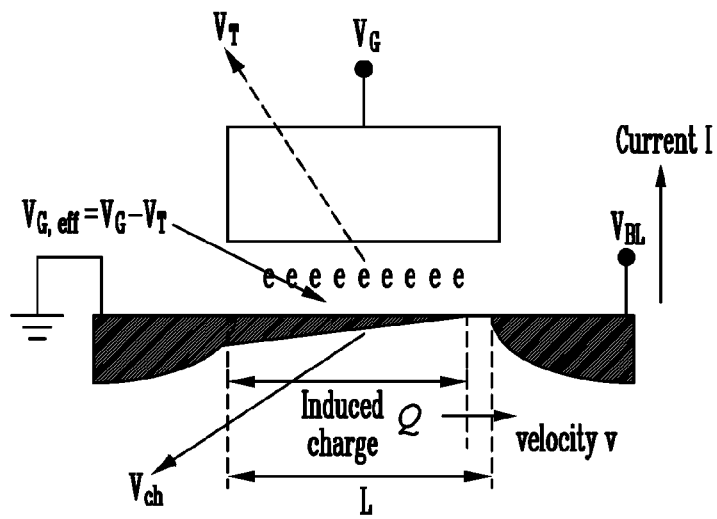
FIG. 3 is a view illustrating a current flow through a memory cell according to an embodiment of the present invention.

FIG. 3 is a view illustrating a current flow through a memory cell according to an embodiment of the present invention.

Referring to FIG. 3, when a gate voltage VG is applied to a gate of a memory cell transistor having a channel length L and a threshold voltage VT, and a drain voltage VBL is applied to a drain thereof, a current I flowing through the memory cell transistor may be expressed by the product of an electric charge Q, induced on a channel of the memory cell transistor, and a carrier velocity v. In order to improve data input and output characteristics, an operating current I of the memory cell transistor is to be increased.

The electric charge Q induced on the channel of the memory cell transistor may be in proportion to VG-VT-Vch, where Vch may be a channel electric potential, Vch at a source side may be 0V, and Vch at a drain side may be VBL. Therefore, the cell current I will be reduced after the memory cell transistor is programmed to increase the threshold voltage VT and the same gate voltage VG is subsequently applied.

The carrier velocity v may depend on an electric field (e.g., E=VBL/L) that is applied to the channel of the memory cell transistor. When the electric field is low, the carrier velocity v may be in proportion to the electric field. However, the carrier velocity may be saturated at an electric field of a predetermined intensity or more. A memory cell transistor, reduced in size to achieve a high degree of integration, has already been operating in a short channel region. After the memory cell transistor is programmed, an effective gate voltage (VG,eff=VG−VT) may be reduced. Thus, shortly after the drain voltage VBL is increased, pinch-off may occur. As a result, the carrier velocity v may be saturated.

Therefore, the operating current I of the memory cell transistor may be increased by preventing saturation of a carrier velocity that may occur in an unselected word line and increasing the amount of the induced electric charge Q by ensuring the effective gate voltage (VG,eff=VG−VT) in the unselected word line.

FIGS. 4A to 4E are views illustrating a cell current in a memory string including the memory cell transistor shown in FIG. 3.

Figure 4A:
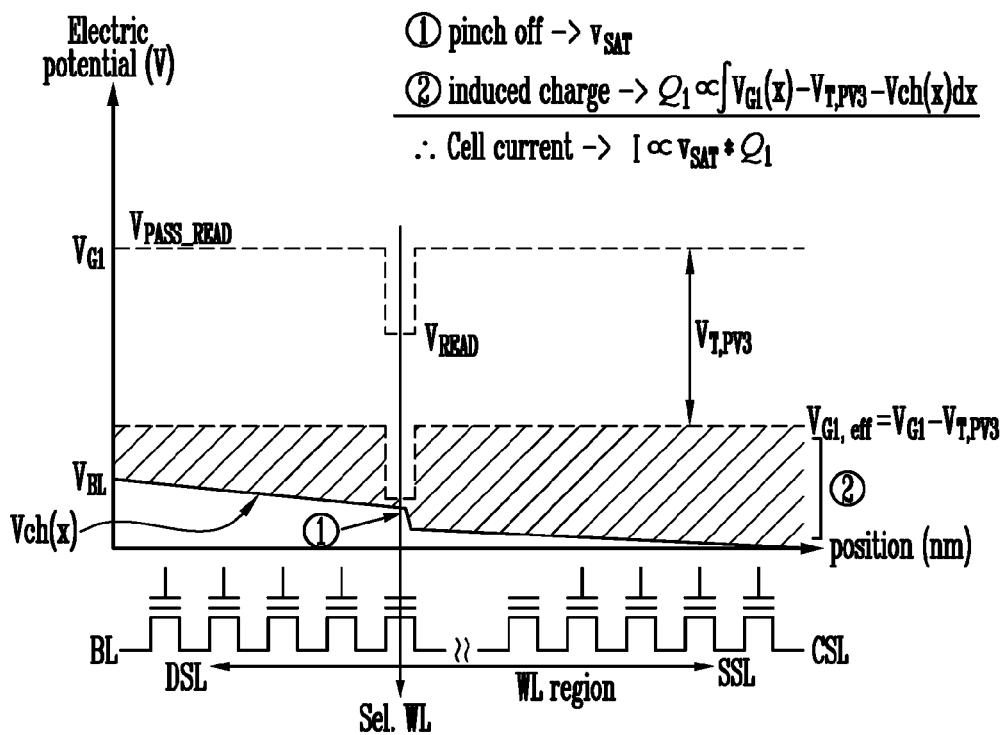
FIGS. 4A to 4E are views illustrating a current flow through a memory string including a memory cell transistor shown in FIG. 3.

Referring to FIG. 4A, the x-axis represents positions of transistors included in a memory string, and the y-axis represents an electric potential at each position. In the memory string, a pass voltage Vpass_read may be applied to an unselected word line, and a read voltage Vread may be applied to a selected word line Sel. WL. A description will be made in reference to an example in which all memory cells are programmed to the highest program level (e.g., PV3), among program levels (e.g., PV1 to PV3). In this example, a threshold voltage of a memory cell may have the highest voltage level (VT, PV3).

Under the above-described conditions, when a predetermined voltage (Vread) is applied to a selected word line in order to perform a read operation (or verify operation), a channel under the selected word line may pinch off. As a result, carrier velocity saturation may occur. Therefore, the operating current I may be ensured by increasing the electric charge Q being induced on the channel. However, since a voltage (Vpass_read) that is applied to unselected word lines is fixed, the induced electric charge Q may decrease as the drain voltage VBL increases.

Figure 4B:
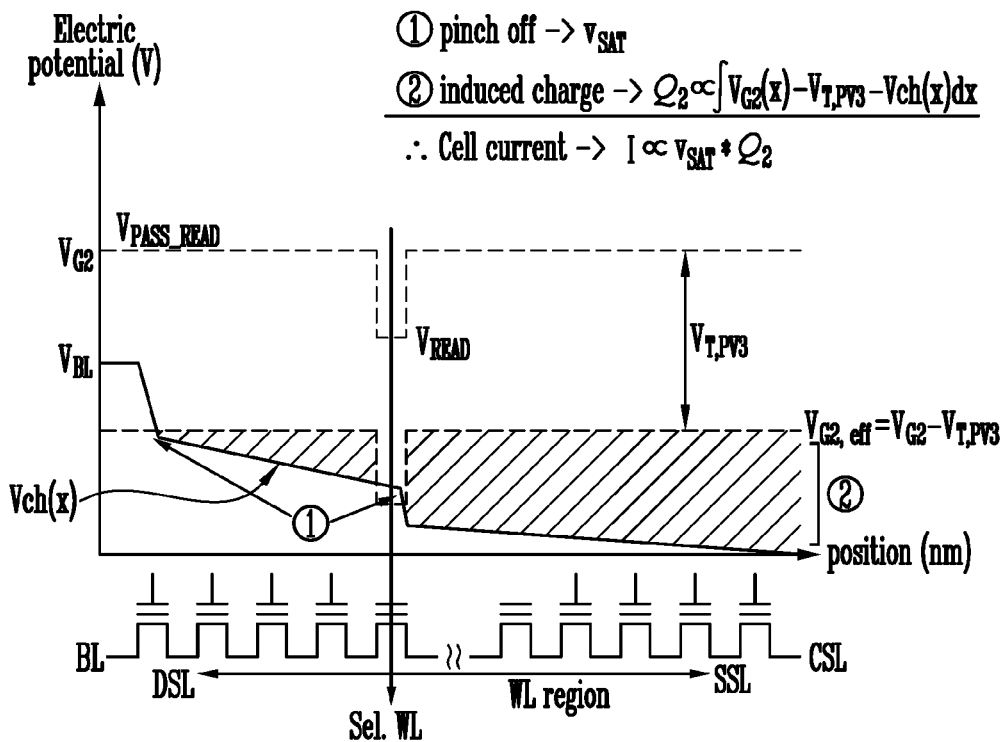

Referring to FIG. 4B, as the drain voltage VBL is further increased, carrier velocity saturation may also occur in a channel of the unselected word line. As a result, the induced electric charge Q may be further reduced.

Figure 4C:
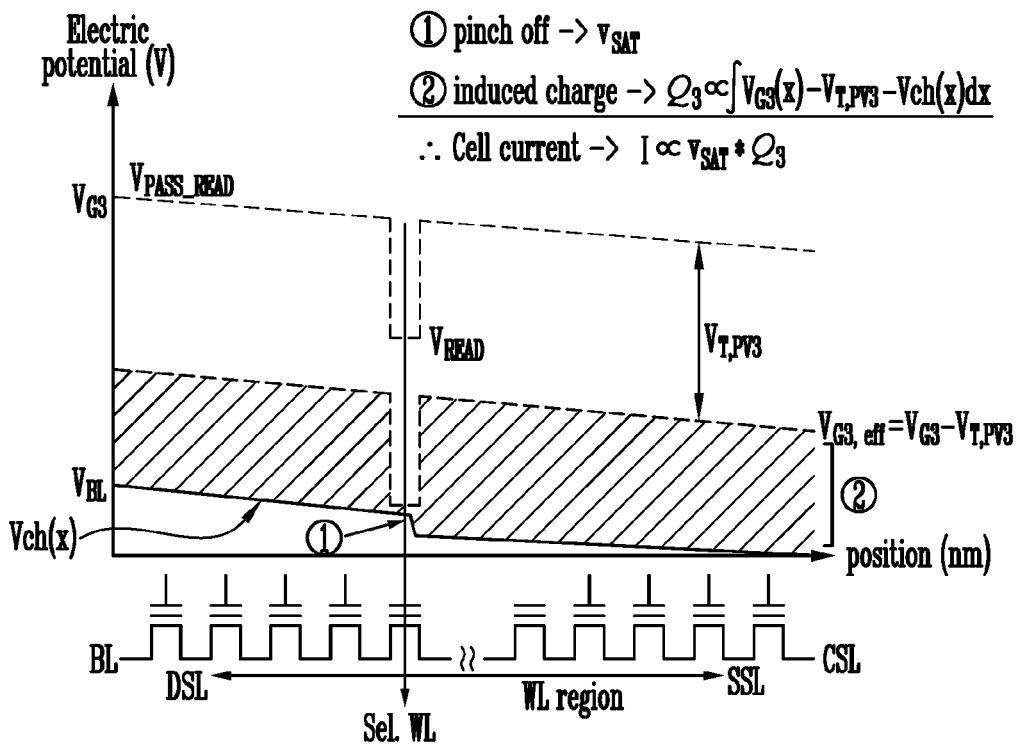
Figure 4D:
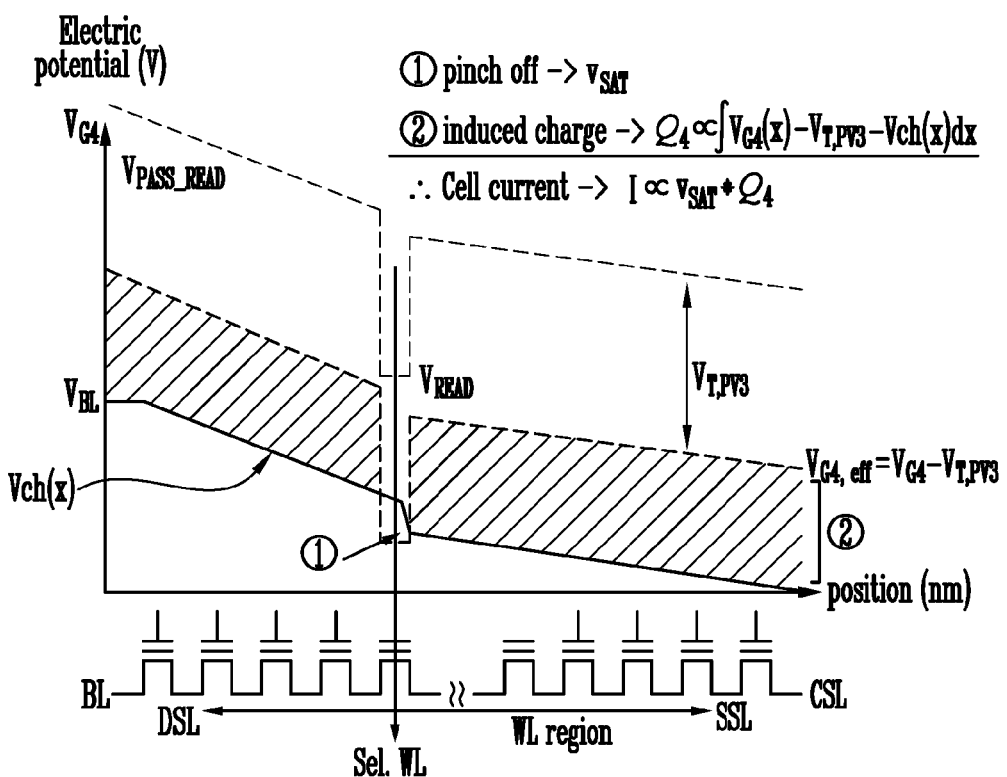

Referring to FIGS. 4C and 4D, the electric charge Q induced on the channel may be ensured by changing a voltage applied to an unselected word line according to a channel potential profile Vch(x). When an electric potential of the unselected word line changes according to the channel potential profile, the electric charge Q may be maintained when the drain voltage VBL is high (see FIG. 4D) as well as when the drain voltage VBL is low (see FIG. 4C).

However, the electric potential of the unselected word line may have to be controlled according to the channel potential profile Vch(x).

Therefore, when the drain voltage VBL having a high voltage level is applied while the electric potential of the unselected word line is controlled according to the channel potential profile Vch (x), a large electric field may occur in unselected word lines Unsel.WL adjacent to a selected word line Sel.WL. As a result, hot carriers may be generated.

Figure 4E:
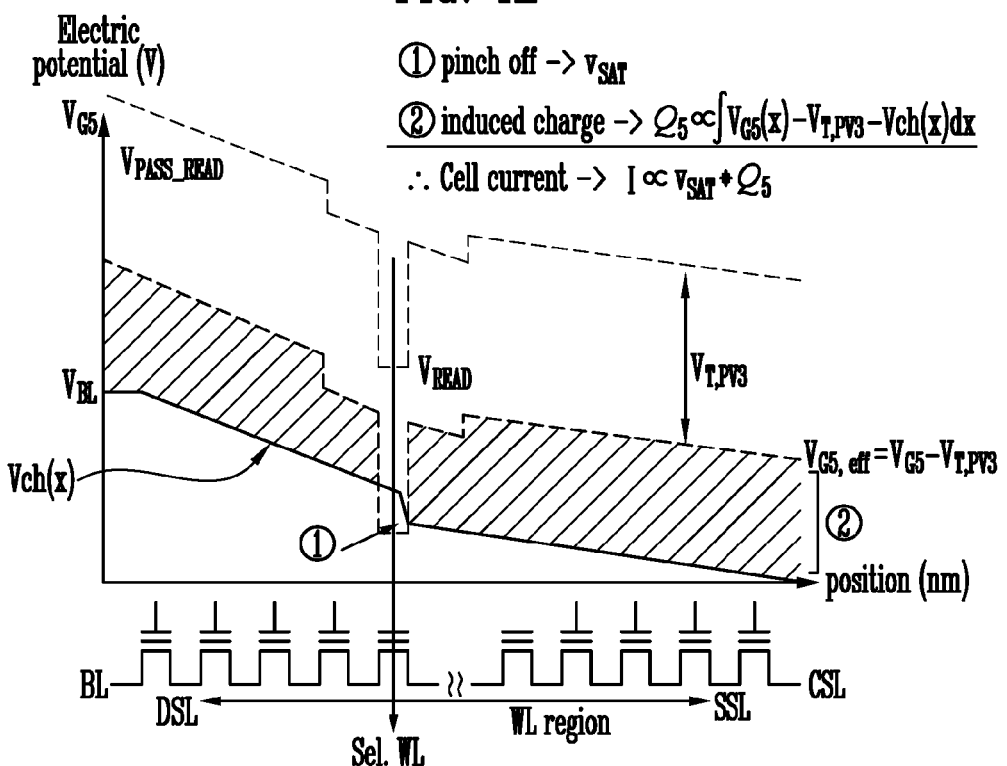

Therefore, as illustrated in FIG. 4E, injection of the hot carriers into memory cells of the unselected word lines Unsel.WL, which is adjacent to a memory cell of the selected word line Sel.WL, may be prevented by controlling voltages applied to the unselected word lines Unsel.WL in order to reduce an electric field in the corresponding region.

Hereinafter, embodiments of the present invention in which the voltages applied to the unselected word lines may be changed according to the channel potential profile Vch(x) are described.

FIGS. 5A to 5F are views illustrating operations of a semiconductor memory apparatus according to embodiments of the present invention.

Figure 5A:
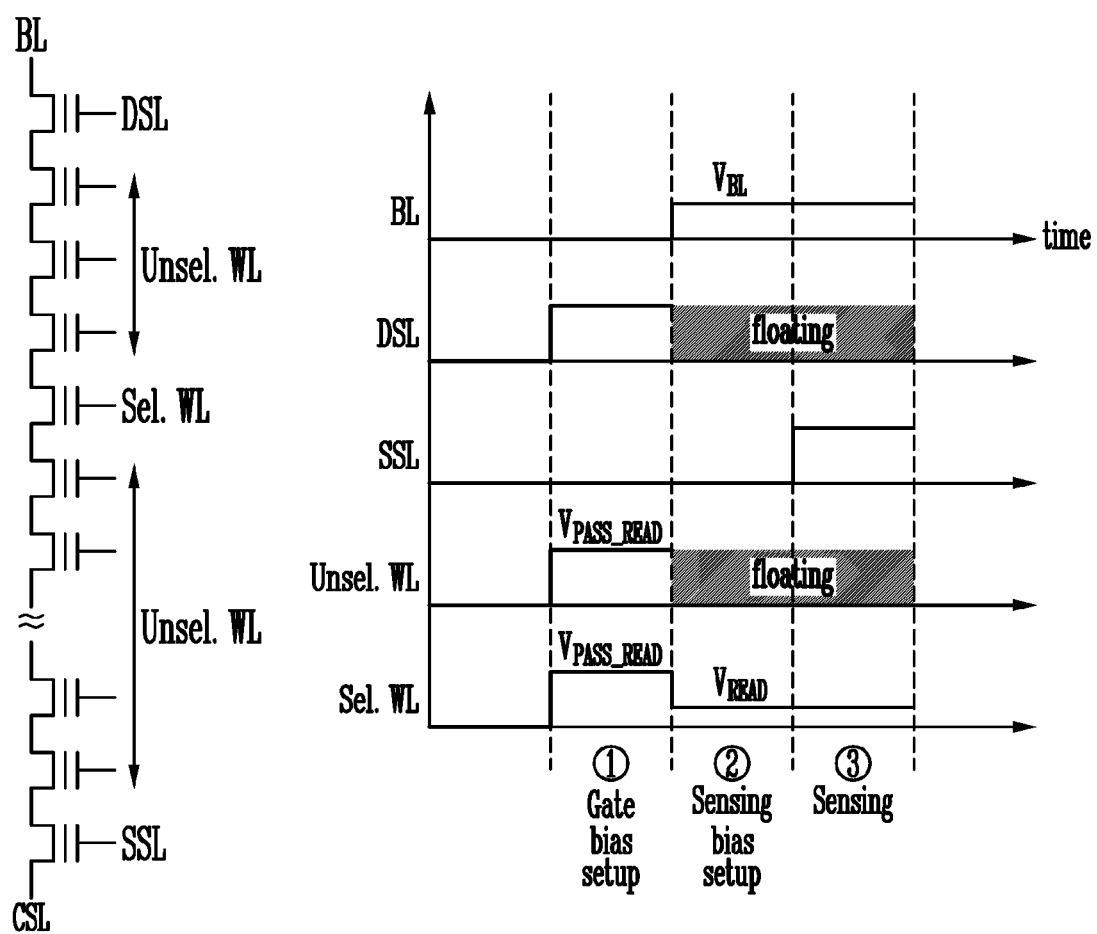
FIGS. 5A to 5G are views illustrating operations of a semiconductor memory apparatus according to embodiments of the present invention.

Referring to FIG. 5A, peripheral circuits (120 to 160 in FIG. 1) may be suitable for applying a precharge voltage VBL to the bit line BL when the unselected word lines Unsel.WL, adjacent to the selected word line SEL.WL, are set to a floating state. This operation is described below in detail.

First, during a gate bias setup period, a positive voltage may be applied to the drain selection line DSL so that the drain selection transistor between the bit line BL and a memory cell may be turned on. In addition, the pass voltage VPASS_READ may be applied to the word lines Sel.WL and Unsel.WL. In other words, the peripheral circuits 120 to 160, shown in FIG. 1, may turn on the drain selection transistor coupled between the bit line BL and the memory cell when the pass voltage VPASS_READ is applied to the word lines Sel.WL and Unsel.WL. As a result, the word lines Sel.WL and Unsel.WL may be precharged by the pass voltage VPASS_READ. In addition, all memory cells in the memory string may be turned on by the pass voltage VPASS_READ, and channel regions of the memory cells may be electrically connected to the bit line BL.

During a sensing bias setup period, the precharge voltage VBL may be applied to the bit line BL, and the read voltage VREAD may be applied to the selected word line Sel.WL. The peripheral circuits 120 to 160, shown in FIG. 1, may apply the precharge voltage VBL to the bit line BL when or after the unselected word lines Unsel.WL, adjacent to the selected word line Sel.WL, are floated. The peripheral circuits 120 to 160, shown in FIG. 1, may float the drain selection line DSL as well as the unselected word lines Unsel.WL.

As described above, when the precharge voltage VBL is applied to the bit line BL while the unselected word lines Unsel.WL are floated, the channel potential profile Vch(x) may be formed, and the electric potential of the unselected word lines Unsel.WL, floated by the capacitor coupling phenomenon, may be changed according to the corresponding channel potential profile Vch(x).

Therefore, since the voltage difference between the word line and the channel, set during the gate bias setup period, is maintained, the channel induced charge may not be changed.

As a result, the operating current of the memory cell transistor may be stably ensured, and data input and output characteristics may not be improved.

Thereafter, during a sensing period, the peripheral circuits 120 to 160, shown in FIG. 1, may apply the positive voltage to the source selection line SSL so that the source selection transistor, coupled between the memory cell and the common source line CSL, may be turned on. In addition, the peripheral circuits may sense changes in voltage (or current amount) of the bit line BL, latch data stored in memory cells and output the latched data.

The peripheral circuits may apply the read voltage VREAD or the verify voltage to the selected word line Sel.WL when or after the precharge voltage VBL is applied to the bit line BL. In addition, the peripheral circuits may apply the read voltage VREAD or a verify voltage to the selected word line Sel.WL when or after the unselected word lines Unsel.WL adjacent to the selected word line Sel. WL are floated.

The time at which the bit line voltage VBL, the pass voltage VPASS_READ and the read voltage VREAD are applied or the time at which the positive voltage is applied to the selection lines DSL and SSL may be applied to embodiments to be described below.

As described above, the same pass voltage VPASS_READ may be applied to all unselected word lines Unsel.WL. However, an operating method of applying different pass voltages varying depending on positions of the unselected word lines Unsel.WL is illustrated with reference to in FIGS. 5B to 5F.

There may be, at least, two main reasons for this operating method.

First, when the read voltage VREAD is applied to output information stored in the selected word line Sel.WL, the electric potential of the unselected word lines Unsel.WL, which are in a floating state, may be changed by the read voltage VREAD of the selected word line Sel.WL as well as the channel potential profile Vch(x) due to a capacitor coupling phenomenon.

Since the read voltage VREAD is generally less than the pass voltage VPASS_READ, the electric potential of the unselected word lines Unsel.WL, which is reduced by the read voltage VREAD, may have to be reduced.

Second, referring to the channel potential profile, V_ch(x), as illustrated in FIGS. 4D and 4E, by floating the unselected word lines Unsel.WL, a strong electric field may be generated in a lower channel of the selected word line Sel.WL and the unselected word lines Unsel.WL adjacent thereto. Since hot carriers, generated by the strong electric field, are likely to be injected into the memory cells of the selected word line Sel.WL and the unselected word lines Unsel.WL adjacent thereto, the electric field may be appropriately controlled by controlling the electric potential of the unselected word lines Unsel.WL.

Figure 5B:
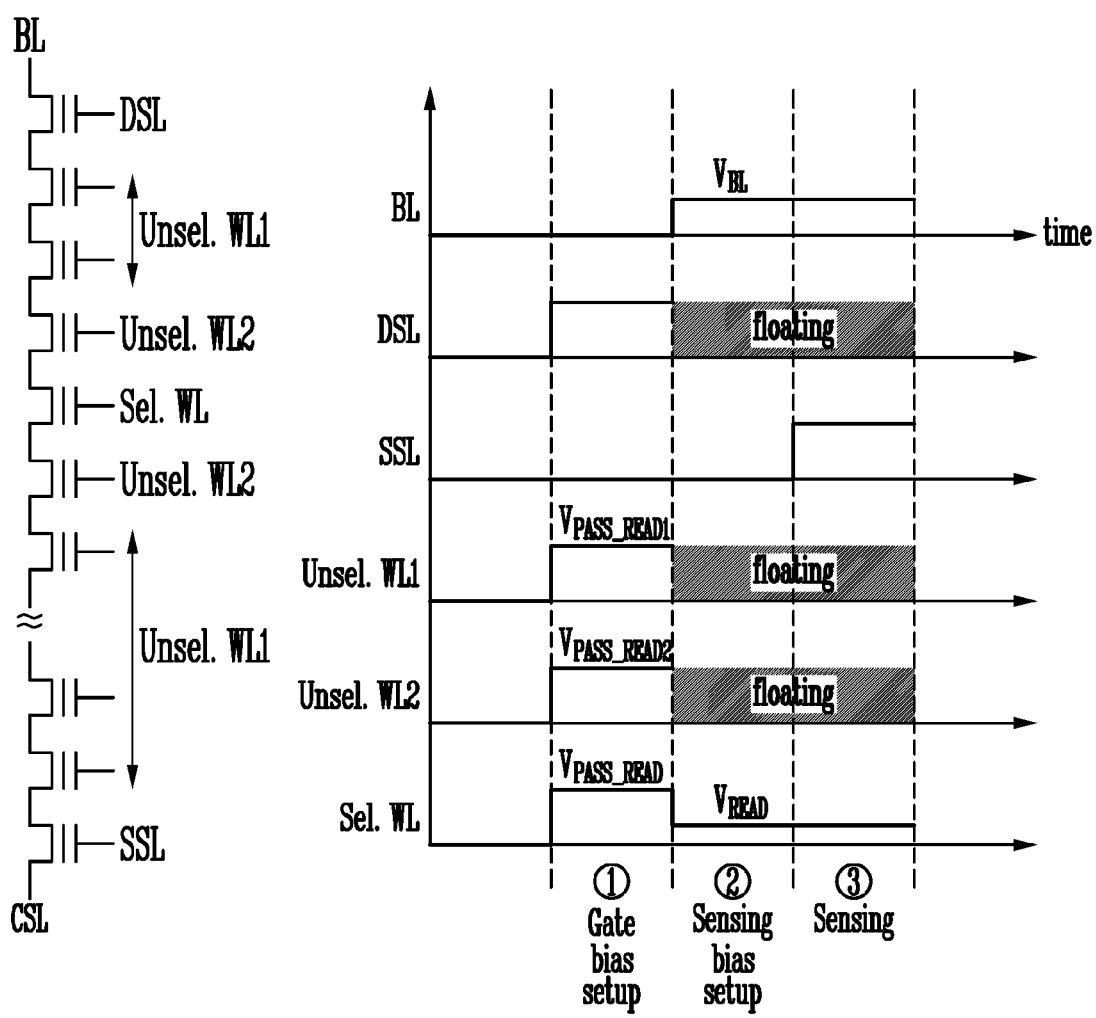

Referring to FIG. 5B, before unselected word lines Unsel.WL1 and Unsel.WL2 are set to a floating state, the peripheral circuits 120 to 160, shown in FIG. 1, may apply a first pass voltage VPASS_READ1 to the unselected word lines Unsel.WL1 not adjacent to the selected word line Sel.WL and apply a second pass voltage VPASS_READ2 to the unselected word lines Unsel.WL2 adjacent to the selected word line Sel.WL during a gate bias setup period.

The second pass voltage VPASS_READ2 may vary and be input in response to the read voltage VREAD.

In general, the second pass voltage VPASS_READ2 satisfying VPASS_READ1+alpha*(VPASS_READ1−VREAD)±beta may be input in consideration of capacitor coupling with the selected word line Sel.WL, in which alpha may be controlled between 0 to 1.0 and may also be adjusted by beta in order to prevent hot carrier generation.

As described above, the same pass voltage VPASS_READ2 may be applied to the unselected word lines Unsel.WL2 adjacent to the selected word line Sel.WL. However, different pass voltages may be applied, depending on the positions of the unselected word lines Unsel.WL1.

Referring to the channel potential profile V_ch(x) in the selected word line Sel.WL, as illustrated in FIGS. 4D and 4E, the unselected word line Unsel.WL adjacent to the selected word line Sel.WL in the direction of the common source line CSL and the unselected word line Unsel.WL adjacent thereto in a direction of the bit line BL may have different channel potentials. Therefore, the electric potentials of the unselected word lines Unsel.WL adjacent thereto may be compensated.

Figure 5C:
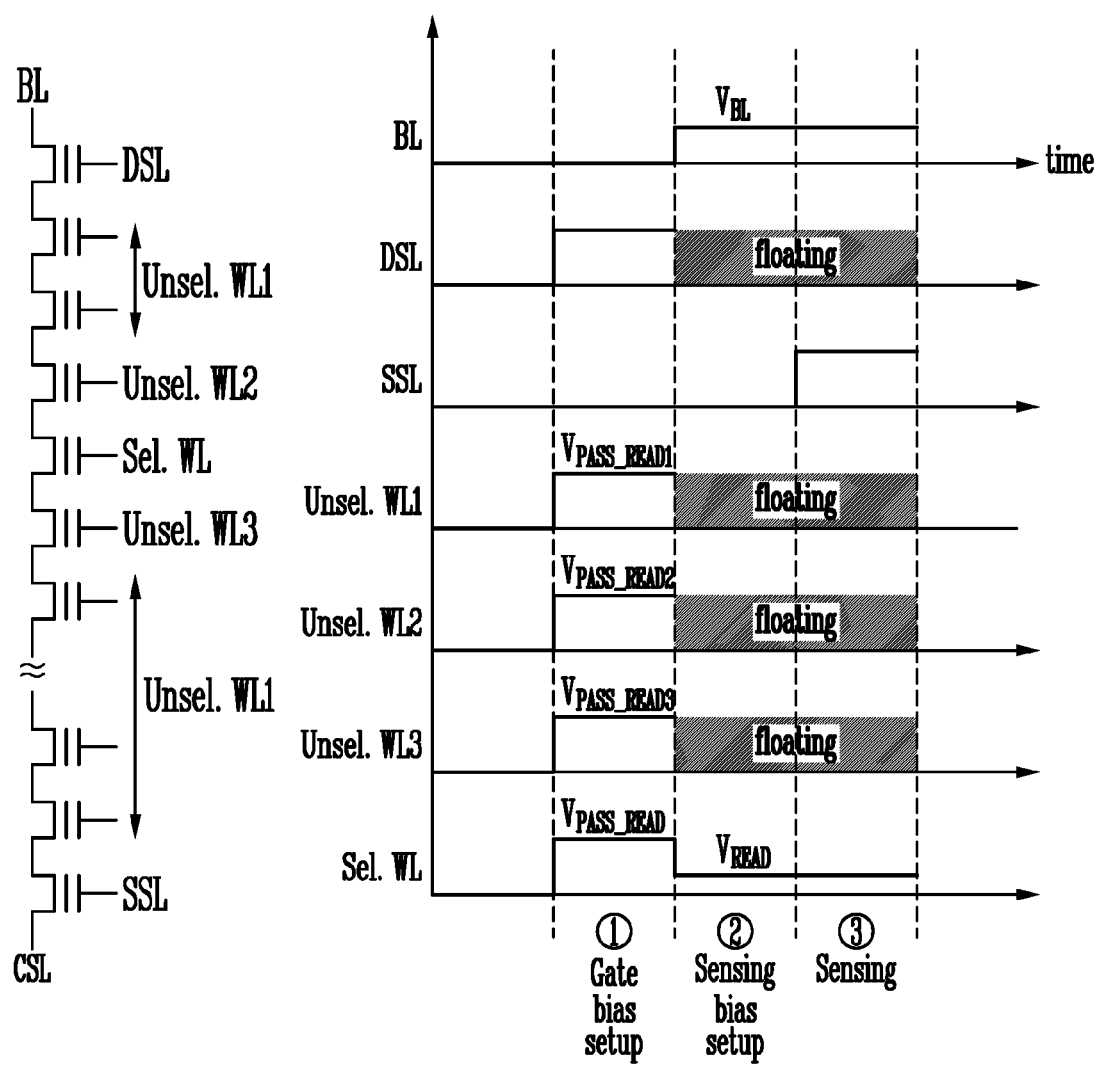

Referring to FIG. 5C, before unselected word lines Unsel.WL1 to Unsel.WL3 are set to a floating state, the peripheral circuits 120 to 160, shown in FIG. 1, may apply the first pass voltage VPASS_READ1 to the unselected word lines Unsel.WL1, not adjacent to the selected word line Sel.WL, the second pass voltage VPASS_READ2 to the unselected word lines Unsel.WL2 adjacent thereto in the direction of the bit line BL and a third pass voltage VPASS_READ3 to the unselected word lines Unsel.WL3 adjacent thereto in the direction of the common source line CSL during a gate bias setup period.

The second pass voltage VPASS_READ2 applied to the unselected word lines Unsel.WL2 in the direction of the bit line BL may be changed and input in response to the read voltage VREAD and the bit line bias VBL.

Generally, the second pass voltage VPASS_READ2 satisfying VPASS_READ1+alpha*(VPASS_READ1−VREAD)±beta+gamma*VBL may be input in consideration of capacitor coupling between the selected word line Sel.WL and the channel, where alpha may be controlled between 0 to 1.0 and may also be adjusted by beta to avoid hot carrier generation, and gamma may be an experience constant and be controlled between −0.5 and 0.5.

The third pass voltage VPASS_READ3 may be changed and input in response to the read voltage VREAD.

Generally, the third pass voltage VPASS_READ3 satisfying VPASS_READ1+alpha*(VPASS_READ1−VREAD)±beta may be input in consideration of capacitor coupling with the selected word line Sel.WL, where alpha may be controlled between 0 to 1.0 and may also be adjusted to avoid hot carrier generation.

As described above, the same pass voltage VPASS_READ1 may be applied to the unselected word lines Unsel.WL1 not adjacent to the selected word line Sel.WL. However, different pass voltages may be applied, depending on the positions of the unselected word lines Unsel.WL1 not adjacent to the selected word line Sel.WL.

Referring to the channel potential profile Vch(x) in the selected word line Sel.WL, shown in FIGS. 4D and 4E, the unselected word line Unsel.WL not adjacent thereto in the direction of the common source line CSL may have a lower channel potential than the unselected word line Unsel.WL not adjacent thereto in the direction of the bit line BL.

Therefore, different pass voltages may be applied, depending on the unselected word lines Unsel.WL1, in order to reduce read disturb in the unselected word line Unsel.WL, not adjacent to the selected word line Sel.WL, caused by the pass voltage VPASS_READ.

Figure 5D:
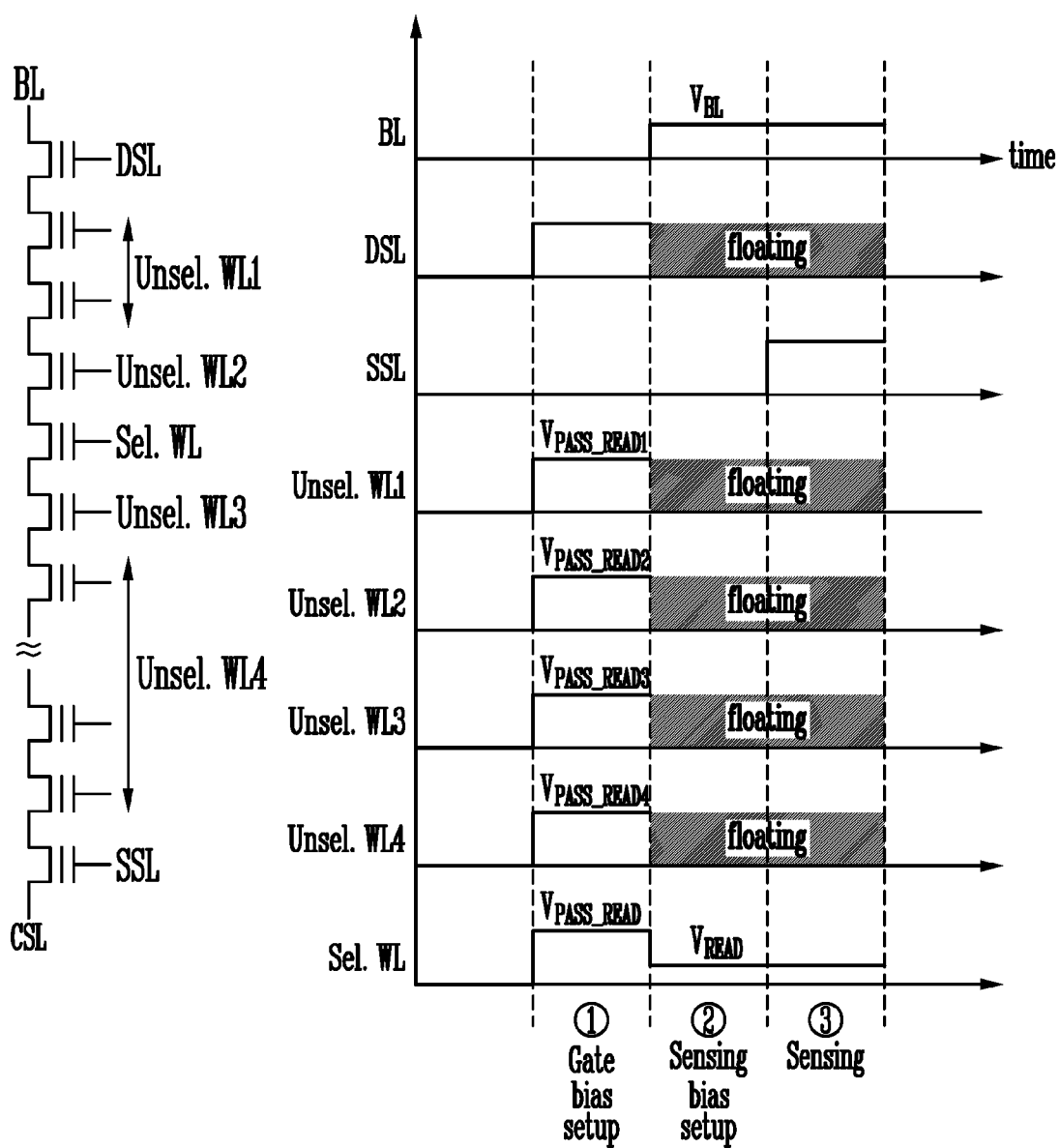

Referring to FIG. 5D, before unselected word lines Unsel.WL1 to Unsel.WL4 are set to the floating state, the peripheral circuits 120 to 160, shown in FIG. 1, may apply the first pass voltage VPASS_READ1 to the unselected word lines Unsel.WL1, not adjacent to the selected word line Sel.WL in the direction of the bit line BL, the second pass voltage VPASS_READ2 to the unselected word lines Unsel.WL2 adjacent thereto in the direction of the bit line BL, the third pass voltage VPASS_READ3 to the unselected word lines Unsel.WL3 adjacent thereto in the direction of the common source line CSL and a fourth pass voltage VPASS_READ4 to the unselected word lines Unsel.WL4 in the direction of the common source line CSL during a gate bias setup period.

The fourth pass voltage VPASS_READ4, applied to the unselected word line Unsel.WL, not adjacent thereto in the direction of the common source line CSL, may be changed and input in response to the bit line bias VBL.

In general, the fourth pass voltage VPASS_READ4 satisfying VPASS_READ1+gamma*VBL may be input in consideration of capacitor coupling between the selected word line Sel.WL and the channel, and gamma may have a value between −1.0 and 0.

As described above, each of the unselected word lines Unsel.WL1 and Unsel.WL4, not adjacent to the selected word line Sel.WL, may be set to the floating state. However, the unselected word lines Unsel.WL1 and Unsel.WL4, not adjacent to the selected word line Sel.WL, may be set to a floating state, depending on the positions thereof.

Referring to the channel potential profile Vch(x), shown in FIGS. 4D and 4E, a voltage drop may mostly occur in the selected word line Sel.WL, and the unselected word line Unsel.WL4 not adjacent in the direction of the common source line CSL may approximate a source voltage (generally, 0V).

Therefore, a voltage may continue to be applied to the unselected word line Unsel.WL4 not adjacent thereto in the direction of the common source line CSL.

The fourth pass voltage VPASS_READ4, applied to the unselected word line Unsel.WL4 not adjacent thereto in the direction of the common source line CSL, may be changed and continue to be input in response to the bit line bias VBL.

In general, the VPASS_READ4 satisfying VPASS_READ1+gamma*VBL may be input, where gamma may have a value ranging between −1.0 and +1.0.

Figure 5E:
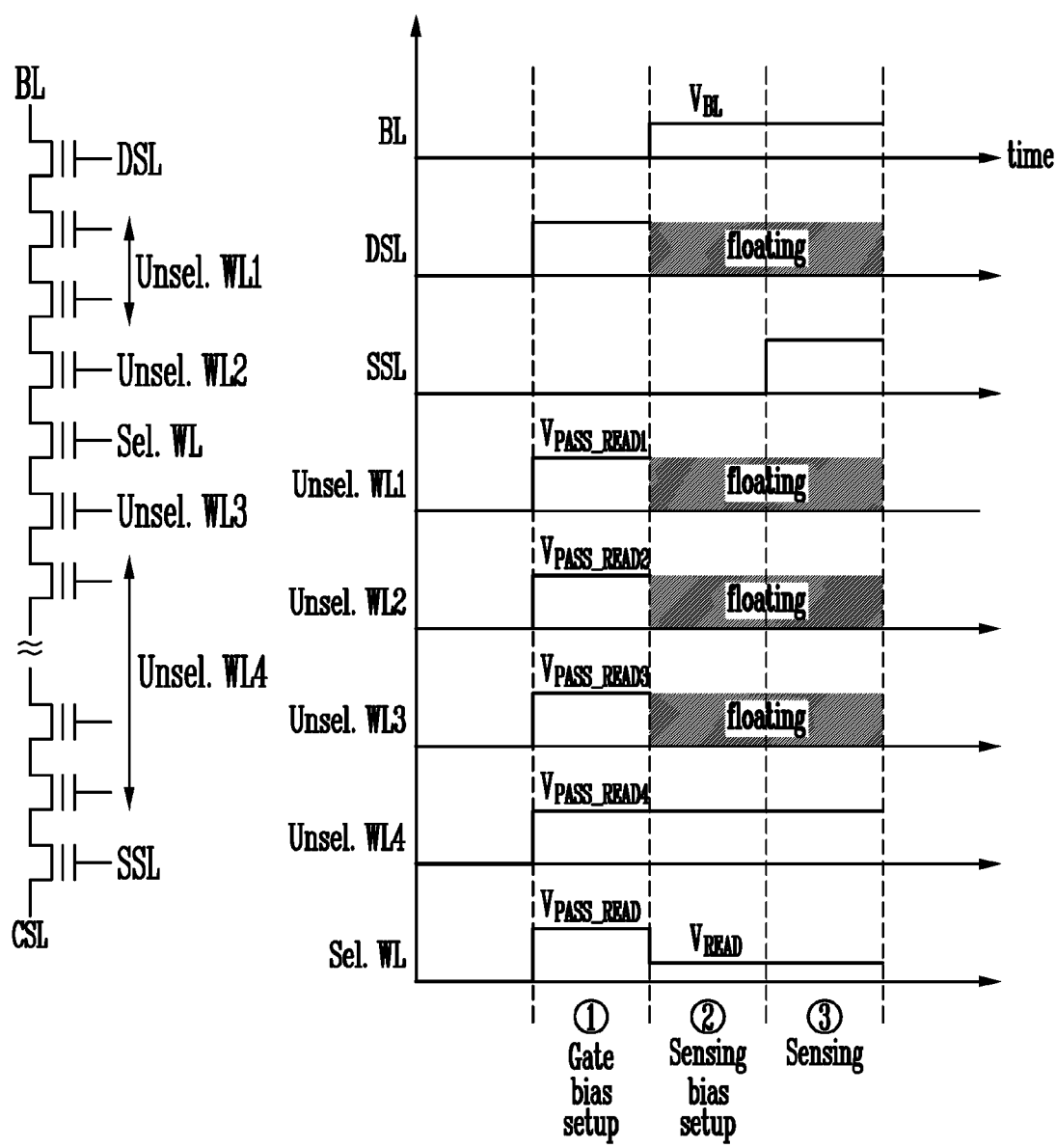

Referring to FIG. 5E, a gate bias setup period may be set as shown in FIG. 5D. During the sensing bias setup period, the peripheral circuits 120 to 160, shown in FIG. 1, may set the selected word line Sel.WL and the unselected word lines Unsel.WL1 not adjacent thereto in the direction of the bit line BL, the unselected word lines Unsel.WL2 adjacent thereto in the direction of the bit line BL and the unselected word lines Unsel.WL3 adjacent thereto in the direction of the common source line CSL to the floating state, and the peripheral circuits 120 to 160 may continue to apply the fourth pass voltage VPASS_READ4 to the unselected word lines Unsel.WL4 in the direction of the common source line CSL.

As described above, both the selected word line Sel.WL and the unselected word lines Unsel.WL2 and Unsel.WL3 adjacent thereto may be set to the floating state. However, the unselected word lines Unsel.WL2 and Unsel.WL3 may be selectively set to the floating state, depending on the positions of the selected word line Sel.WL and the unselected word lines Unsel.WL2 and Unsel.WL3 adjacent thereto.

Referring to the channel potential profile Vch(x), shown in FIGS. 4D and 4E, a voltage drop may mostly occur in the selected word line Sel.WL, and the unselected word lines Unsel.WL4 not adjacent thereto in the direction of the common source line CSL and the unselected word line Unsel.WL3 adjacent thereto in the direction of the common source line CSL may approximate a source voltage (generally, 0V).

Therefore, a voltage may also be applied to the unselected word line Unsel.WL3 adjacent thereto in the direction of the common source line CSL as well as the unselected word line Unsel.WL4 not adjacent thereto in the direction of the common source line CSL.

The third pass voltage VPASS_READ3, applied to the unselected word line Unsel.WL3 in the direction of the common source line CSL, may be changed in response to the bit line voltage VBL and continue to be input.

In general, the third pass voltage VPASS_READ3 satisfying VPASS_READ1+gamma*VBL may be input, and gamma may have a value between −1.0 and +1.0.

Figure 5F:
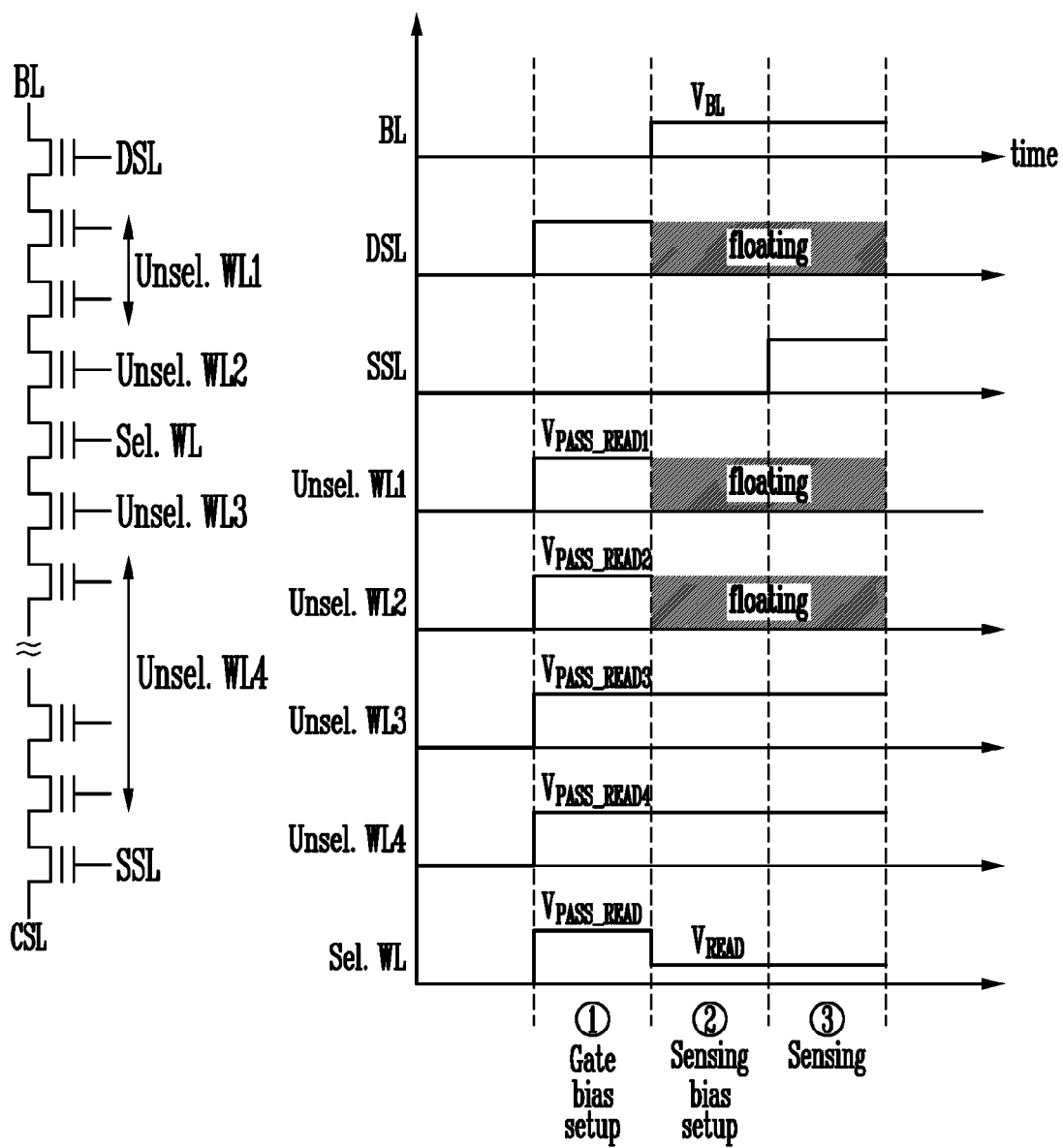

Referring to FIG. 5F, a gate bias setup period may be set as illustrated in FIG. 5D. During a sensing bias setup period, the peripheral circuits 120 to 160, shown in FIG. 1, may apply the precharge voltage VBL to the bit line BL when the selected word line Sel.WL and the unselected word lines Unsel.WL1 and Unsel.WL2 adjacent thereto in the direction of the bit line BL are set to a floating state.

The peripheral circuits 120 to 160, shown in FIG. 1, may continue to apply the pass voltages VPASS_READ3 and VPASS_READ4 to the selected word line Sel.WL and the unselected word lines Unsel.WL3 and Unsel.WL4 in the direction of the common source line CSL.

Figure 5G:
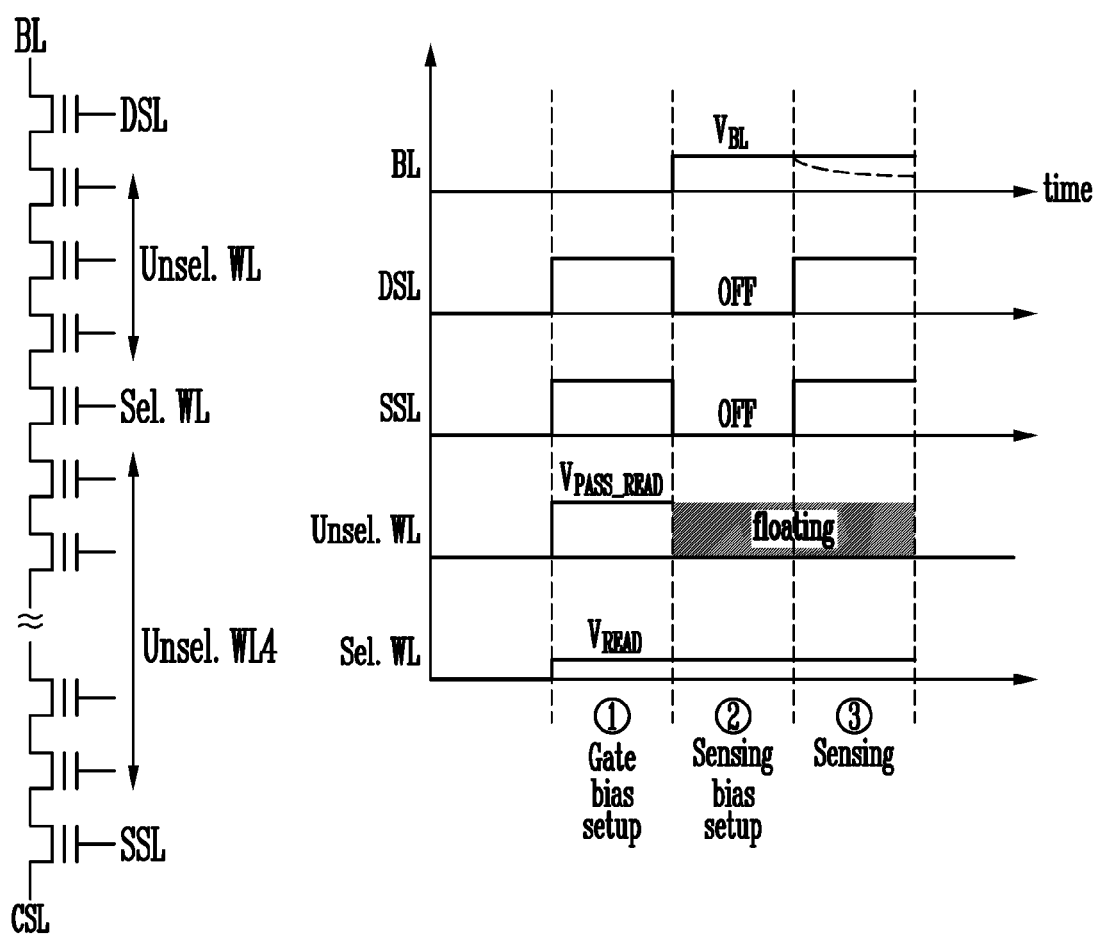

Referring to FIG. 5G, during a gate bias setup period, when the pass voltage VPASS_READ is applied to the unselected word lines Unsel.WL, both the drain selection transistor and the source selection transistor may be turned on by applying the positive voltage to the selection lines DSL and SSL. During the sensing bias setup period, while the precharge voltage VBL is applied to the bit line BL and the unselected word lines Unsel.WL to the floating state, the drain selection transistor and the source selection transistor may be turned off by applying a ground voltage to the selection lines DSL and SSL. Subsequently, during a sensing period, while the precharge voltage VBL is applied to the bit line BL and the unselected word lines Unsel.WL are set to the floating state, the drain selection transistor and the source selection transistor may be turned on by applying the positive voltage to the selection lines DSL and SSL.

The unselected word lines Unsel.WL may be selectively floated by the method described above with reference to FIGS. 5B to 5F. In addition, the pass voltage applied to the unselected word lines Unsel.WL may be set by the method described above with reference to FIGS. 5B to 5F.

As described above, during the gate bias setup period, when the pass voltage VPASS_READ is applied to the selected word lines Unsel.WL, a read speed may be improved by reducing the time it takes to precharge the word lines by turning on all selection transistors. In addition, read stress caused by a read bias may be reduced by turning off all selection transistors during the sensing bias setup period.

Under the above-described conditions, when pass voltages are applied to unselected word lines, and a precharge voltage is applied to a bit line while a part or all of the unselected word lines are floated, an operating current may be sufficiently ensured to improve data input and output characteristics.

Figure 6:
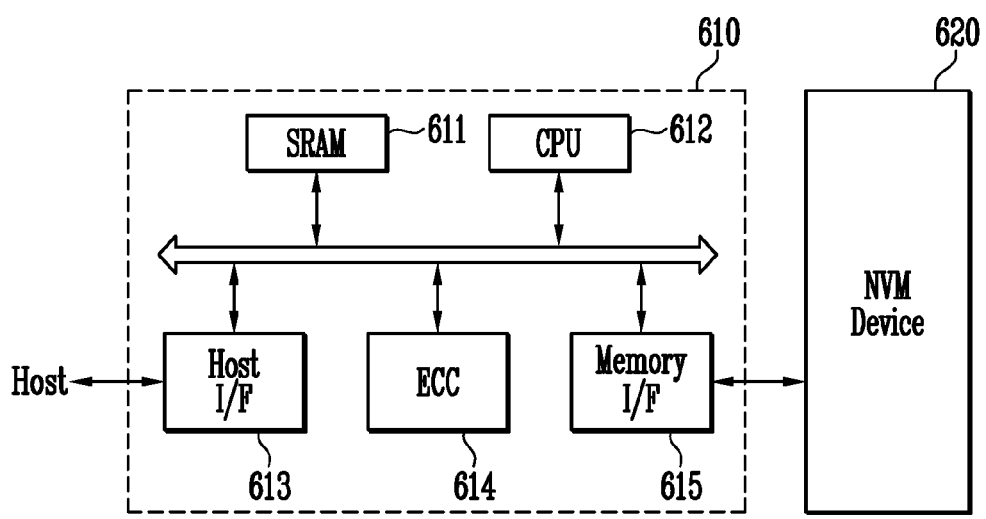
FIG. 6 is a schematic block diagram illustrating a memory system according to an embodiment of the present invention.

FIG. 6 is a schematic block diagram of a memory system according to an embodiment of the present invention.

Referring to FIG. 6, a memory system 600 according to an embodiment of the present invention may include a non-volatile memory apparatus 620 and a memory controller 610.

The non-volatile memory apparatus 620 may be composed of the above-described semiconductor memory apparatus. The memory controller 610 may be suitable for controlling the non-volatile memory apparatus 620.

The memory system 600 having the above-described configuration may be a memory card or a solid state disk (SSD) in which the non-volatile memory apparatus 620 and the memory controller 610 are combined. SRAM 611 may function as an operation memory of a CPU 612. A host interface 613 may include a data exchange protocol of a host being coupled to the memory system 600. An ECC 614 may detect and correct errors included in a data read from the non-volatile memory apparatus 620. A memory interface 614 may interface with the non-volatile memory apparatus 620. The CPU 612 may perform the general control operation for data exchange of the memory controller 610.

Though not illustrated in FIG. 6, the memory system 600 may further include ROM (not illustrated) that stores code data to interface with the host. In addition, the non-volatile memory apparatus 620 may be a multi-chip package composed of a plurality of flash memory chips. The memory system 600 may be provided as a storage medium having high reliability and low error rate. A flash memory apparatus according to an embodiment of the present invention may be provided in a memory system such as a semiconductor disk device (a solid state disk (SSD)) on which research has been actively conducted. For example, when the memory system 600 is an SSD, the memory controller 110 may communicate with the outside (e.g., a host) through one of the interface protocols including USB, MMC, PCI-E, SATA, PATA, SCSI, ESDI and IDE.

Figure 7:
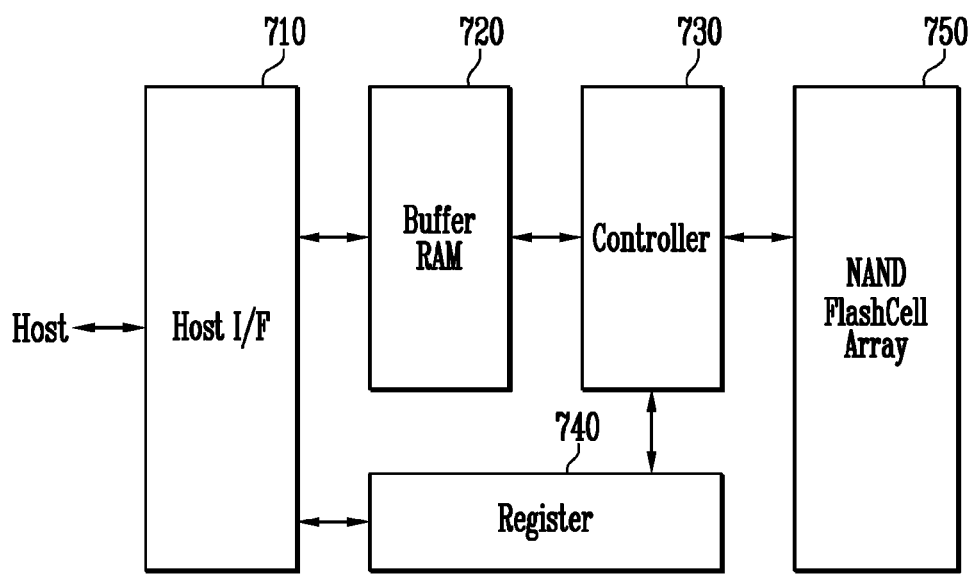
FIG. 7 is a schematic block diagram illustrating a fusion memory apparatus or a fusion memory system according to the aforementioned various embodiments.

FIG. 7 is a schematic block diagram of a fusion memory apparatus or a fusion memory system that performs a program operation according to the aforementioned various embodiments. For example, technical features of the present invention may be applied to a OneNand flash memory apparatus 700 as the fusion memory apparatus.

The OneNand flash memory apparatus 700 may include a host interface (I/F) 710, a buffer RAM 720, a controller 730, a register 740 and a NAND flash cell array 750. The host interface 710 may be suitable for exchanging various types of information with a device through a different protocol. The buffer RAM 720 may have built-in codes for driving the memory apparatus or temporarily store data. The controller 730 may be suitable for controlling read and program operations and every state in response to a control signal and a command that are externally given. The register 740 may be suitable for storing data including instructions, addresses and configurations defining a system operating environment in the memory apparatus. The NAND flash cell array 750 may include operating circuits including non-volatile memory cells and page buffers. In response to a write request from a host, the OneNAND flash memory apparatus 700 may program data in the aforementioned manner.

Figure 8:
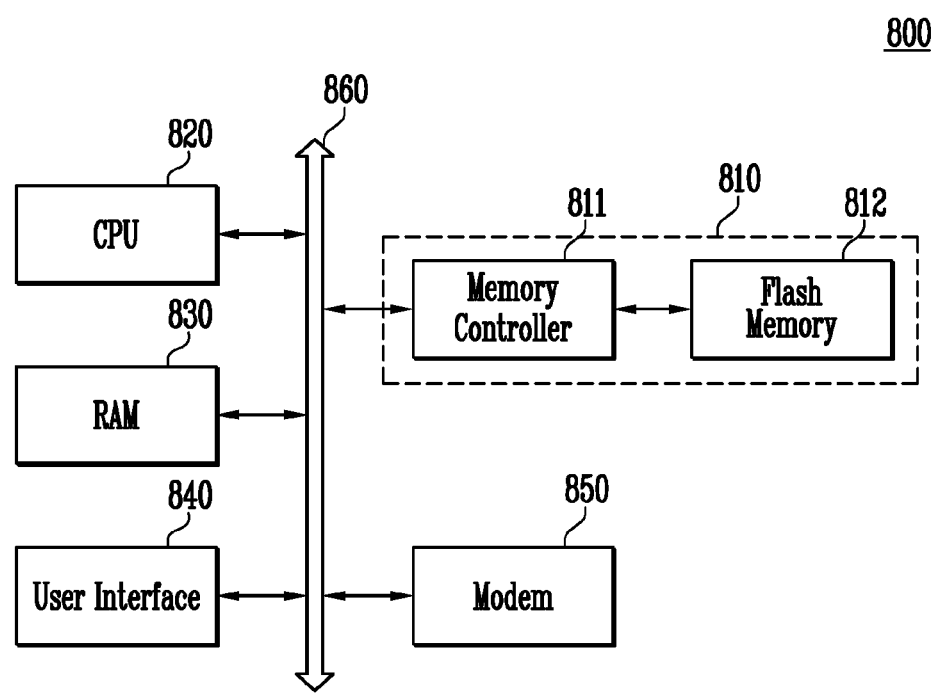
FIG. 8 is a schematic block diagram illustrating a computing system including a flash memory apparatus according to an embodiment of the present invention.

FIG. 8 is a schematic block diagram of a computing system including a flash memory apparatus 812 according to an embodiment of the present invention.

Referring to FIG. 8, a memory system 810 according to an embodiment of the present invention may include a flash memory 812 and a memory controller 811.

The flash memory 812 may be composed of the above-described semiconductor memory apparatus. The memory controller 811 may be suitable for controlling the flash memory 812.

A computing system 800 according to an embodiment of the present invention may include a microprocessor (CPU) 820, RAM 830, a user interface 840, a modem 850, such as a baseband chipset, and a memory system 810 that are electrically coupled to a system bus 860. In addition, if the computing system 800 is a mobile device, then a battery may be provided to apply operating voltages to the computing system 800. Though not shown in FIG. 8, the computing system 800 may further include application chipsets, a Camera Image Processor (CIS), or mobile DRAM. The memory system 810 may form a Solid State Drive/Disk (SSD) that uses a non-volatile memory to store data. The memory system 810 may be provided as a fusion flash memory (e.g., OneNAND flash memory).

A semiconductor memory apparatus according to an embodiment of the present invention may improve operating characteristics.

What is claimed is:

1. A semiconductor memory apparatus, comprising:
   a memory block configured to include memory cells coupled between a bit line and a source line and operating in response to voltages applied to word lines; and
   a peripheral circuit configured to performing operations relating to data input and output of the memory cells,
   wherein the peripheral circuit is further configured to apply a precharge voltage to the bit line when word lines adjacent to a selected word line are set to a floating state, and to apply pass voltages having different voltage levels to word lines based on being adjacent to the selected word lines before the word lines adjacent to the selected word line are set to the floating state.

2. The semiconductor memory apparatus of claim 1, wherein the peripheral circuit is further configured to apply the precharge voltage to the bit line when or after the word lines adjacent to the selected word line are floated.

3. The semiconductor memory apparatus of claim 2, wherein the peripheral circuit is further configured to apply a read voltage or the verify voltage to the selected word line when or after the precharge voltage is applied to the bit line.

4. The semiconductor memory apparatus of claim 1, wherein the peripheral circuit is further configured to turn on a drain selection transistor between the bit line and the memory cell before the word lines adjacent to the selected word line are floated.

5. The semiconductor memory apparatus of claim 1, wherein the peripheral circuit is further configured to float the word lines adjacent to the selected word line after a pass voltage is applied to the word lines.

6. The semiconductor memory apparatus of claim 5, wherein the peripheral circuit is further configured to apply the precharge voltage to the bit line after the pass voltage is applied to the word lines.

7. The semiconductor memory apparatus of claim 5, wherein the peripheral circuit is further configured to turn on a drain selection transistor coupled between the bit line and the memory cell when the pass voltage is applied to the word lines.

8. The semiconductor memory apparatus of claim 1, wherein the peripheral circuit is further configured to apply a read voltage or a verify voltage to the selected word line when or after the word lines adjacent to the selected word line are floated.

9. The semiconductor memory apparatus of claim 8, wherein the peripheral circuit is further configured to apply the read voltage or the verify voltage after a pass voltage is applied to the selected word line.

10. The semiconductor memory apparatus of claim 8, wherein the peripheral circuit is further configured to turn on a source selection transistor electrically connecting the source line and the memory cell after the read voltage or the verify voltage is applied to the selected word line.

11. The semiconductor memory apparatus of claim 1, wherein the peripheral circuit is further configured to turn on a source selection transistor electrically connecting the source line and the memory cell after the word lines adjacent to the selected word line are floated.

12. The semiconductor memory apparatus of claim 1, wherein the peripheral circuit is further configured to apply a first pass voltage to word lines not adjacent to the selected word line and to apply a second pass voltage to the word lines adjacent to the selected word line before the word lines adjacent to the selected word line are set to the floating state.

13. The semiconductor memory apparatus of claim 1, wherein the peripheral circuit is further configured to apply a first pass voltage to word lines not adjacent to the selected word line, to apply a second pass voltage to a word line adjacent to the selected word line in one direction and to apply a third pass voltage to a word line adjacent to the selected word line in the other direction before the word lines adjacent to the selected word line are set to the floating state.

14. The semiconductor memory apparatus of claim 1, wherein the peripheral circuit is further configured to apply a first pass voltage to word lines not adjacent to the selected word line in one direction, to apply a second pass voltage to a word line adjacent to the selected word line in the one direction, to apply a third pass voltage to a word line adjacent to the selected word line in the other direction and to apply a fourth pass voltage to word lines not adjacent to the selected word line in the other direction before the word lines adjacent to the selected word line are set to the floating state.

15. The semiconductor memory apparatus of claim 14, wherein the peripheral circuit is further configured to set the word lines not adjacent to the selected word line in the one direction and the word lines not adjacent to the selected word line in the other direction to the floating state when the word lines adjacent to the selected word line are set to the floating state.

16. The semiconductor memory apparatus of claim 13, wherein the peripheral circuit is further configured to set the word lines not adjacent to the selected word line in the one direction to the floating state when the word lines adjacent to the selected word line are set to the floating state.

17. The semiconductor memory apparatus of claim 1, wherein the peripheral circuit is further configured to set a gate of a drain selection transistor coupled between the bit line and the memory cell to the floating state when the word lines adjacent to the selected word line are set to the floating state.

* * * * *